(12) United States Patent
Krishnan

(10) Patent No.: US 6,359,298 B1
(45) Date of Patent: Mar. 19, 2002

(54) CAPACITIVELY COUPLED DTMOS ON SOI FOR MULTIPLE DEVICES

(75) Inventor: Srinath Krishnan, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/619,838

(22) Filed: Jul. 20, 2000

(51) Int. Cl.[7] ............ H01L 27/108; H01L 29/76; H01L 29/94; H01L 31/119
(52) U.S. Cl. ............................ 257/300; 257/350
(58) Field of Search ............... 257/300, 350, 257/296

(56) References Cited

U.S. PATENT DOCUMENTS

| 5,559,368 A | 9/1996 | Hu et al. |
| 5,780,899 A | 7/1998 | Hu et al. |
| 5,889,293 A | 3/1999 | Rutten et al. |
| 5,994,738 A | 11/1999 | Wollesen |
| 6,111,778 A * | 8/2000 | MacDonald et al. ........ 365/149 |
| 6,285,052 B1 * | 9/2001 | Draper ........................ 257/300 |

* cited by examiner

Primary Examiner—Ngân V. Ngô
(74) Attorney, Agent, or Firm—Amin & Turocy, LLP

(57) ABSTRACT

A MOSFET multiple device structure is provided. The structure comprises a plurality of MOSFET devices sharing at least one heavily doped region extending underneath a gate region of at least two of the plurality of MOSFET devices. The shared heavily doped region provides a capacitive coupling forming a capacitive voltage divider with the junction capacitance of the MOSFET devices between a body region and the gate region.

19 Claims, 9 Drawing Sheets

CAPACITIVELY COUPLED DTMOS ON SOI FOR MULTIPLE DEVICES

FIELD OF THE INVENTION

The present invention generally relates to the design of field effect transistors (FETS) and, more particularly, to a device with multiple metal oxide silicon (MOS) transistor structures configured to operate as dynamic threshold metal oxide silicon (DTMOS) structures, which facilitates mitigation of the operational voltage limitation associated with conventional DTMOS transistor structures.

BACKGROUND OF THE INVENTION

As is known in the art, transistors such as metal oxide silicon (MOS) transistors, have been formed in isolated regions of a semiconductor body such as an epitaxial layer which was itself formed on a semiconductor, typically bulk silicon, substrate. With an n-channel MOS field effect transistor (FET), the body is of p-type conductivity and the source and drain regions are formed in the p-type conductivity body as $N^+$ type conductivity regions. With a p-channel MOSFET, the body, or epitaxial layer, is of n-type conductivity and the source and drain regions are formed in the n-type conductivity body as $P^+$ type conductivity regions. It has been suggested that the semiconductor body, or layer, be formed on an insulating substrate, or over an insulation layer formed in a semiconductor substrate. Such technology sometimes is referred to as Silicon-on-Insulator (SOI) technology. Silicon-on-Insulator MOS technologies have a number of advantages over bulk silicon MOS transistors. These advantages include: reduced source/drain capacitance and hence improved speed performance at higher-operating frequencies; reduced $N^+$ to $P^+$ spacing and hence higher packing density due to ease of isolation; and higher "soft error" upset immunity (i.e., the immunity to the effects of alpha particle strikes).

Silicon-on-Insulator technology is characterized by the formation of a thin silicon layer for formation of the active devices over an insulating layer, such as an oxide, which is in turn formed over a substrate. Transistor sources in drains are formed by, for example, implantations into the silicon layer while transistor gates are formed by forming a patterned oxide and conductor (e.g. metal) layer structure. Such structures provide a significant gain in performance by having lower parasitic capacitance (due to the insulator layer) and increased drain current due to floating body charging effects (since no connection is made to the channel region and charging of the floating body provides access towards a majority of carriers which dynamically lower the threshold voltage, resulting in increased drain current). However, the floating body can introduce dynamic instabilities in the operation of such a transistor.

An SOI field effect transistor combines two separated immunity groups, generally formed by implantation, constituting the source and drain of the transistor with the general region (device body) between them covered by a thin gate insulator and a conductive gate. Typically no electrical connection is made to the channel region and therefore the body is electrically floating. Because the source and drain regions normally extend entirely through the thin silicon layer, the electrical potential of the body is governed by Kirchoffs current law, wherein the sum of the currents flowing into the body equals the sum of the currents flowing out of the body. Because the channel potential is dependent on the body voltage, the device threshold voltage varies as a function of the body voltage.

The boundaries between the channel region and the source and drain, respectively, form junctions which are normally reversed biased. Conduction in the channel region normally occurs immediately below the gate insulator in the region in which depletion can be controlled by a gate voltage. However, the junctions at the boundary of the source and drain also form a parasitic lateral bipolar transistor, which, in effect exists somewhat below the field effect transistor and may supplement desired channel current. On the other hand, the parasitic bipolar device cannot be controlled and under some bias conditions, the operation of the parasitic bipolar device may transiently dominate the operation of the field effect transistor and effectively occupy substantially the entire silicon layer at times when the channel current is not desired.

When the device is switching, the body is coupled to various terminals of the device because there are capacitances between the body and gate, body and source, and body and drain respectively. When the voltage at the various terminal changes, the body voltage changes as a function of time which in turn effects the device threshold voltage. In certain cases, this relationship may be harmful to a device (e.g., inverter). For example, when the gate of an inverter is switched on the drain is discharged (which is typically the output of the inverter)—thus the drain voltage falls when the gate is switched ON. Because the drain and body are capacitively coupled, when the drain voltage drops so does the body voltage. There is an inverse relationship between the body voltage and the threshold voltage. For an NMOS device, when the body voltage falls, the device threshold voltage increases. When the body voltage increases the threshold voltage decreases. Thus, the capacitive coupling between the drain and the body results in the device losing drive current as the device is being switched.

In SOI transistors there is a lack of a bulk silicon or body contact to the MOS transistor. In some devices, it is desirable to connect the p-type conductivity body in the case of an n-channel MOSFET, or the n-type conductivity body in the case of a p-channel MOSFET, to a fixed potential. This prevents various hysteresis effects associated with having the body potential "float" relative to ground. With bulk silicon MOSFETs such is relatively easy because the bottom of the bulk silicon can be easily electrically connected to a fixed potential.

SOI devices also exhibit a kink effect which originates from impact ionization. When an SOI MOSFET is operated at a relatively large drain-to-source voltage, channel electrons with sufficient energy cause impact ionization near the drain end of the channel. The generated holes build up in the body of the device, thereby raising the body potential. The increased body potential reduces the threshold voltage of the MOSFET. This increases the MOSFET current and causes the so-called "kink" in SOI MOSFET current vs. voltage (I-V) curves.

With regard to the lateral bipolar action, if the impact ionization results in a large number of holes, the body bias may be raised sufficiently so that the source region to body p-n junction is forward biased. The resulting emission of minority carriers into the body causes a parasitic npn bipolar transistor between source, body and drain to turn on, leading to loss of gate control over the MOSFET current.

A solution to controlling floating body effects and threshold voltages is known as a dynamic threshold metal oxide field effect transistor (DTMOS). A large improvement over regular MOSFET can be achieved when the gate and body of the MOSFET are electrically coupled. These devices offer improvements in power consumption in addition to reduced threshold voltages and faster switching times. This advantage is enhanced for SOI devices where base current and capacitances are appreciably reduced because of very small junction areas. However, these device are limited to operation of about a diode drop 0.6–0.8 volts. If the voltage rises above a diode drop, the body to source and body to drain parasitic diodes will turn on and gate control will be lost. This can result in a very high current from source to drain, which may even result in destruction of the device.

In view of the above, it is apparent that there is a need in the art for a device which mitigates some of the negative effects mentioned above, relating to disadvantages of DTMOS SOI devices.

SUMMARY OF THE INVENTION

The present invention provides for a multiple DTMOS structure and method for making the same. The device of the present invention mitigates some of the aforementioned problems associated with DTMOS devices. The device of the present invention includes drain and source regions and lightly doped source and drain regions (LDD regions). The device also includes a heavily doped region alongside the drain and source regions and the LDD regions. The heavily doped region is shared by the multiple DTMOS structures and provides a capacitive coupling of the gate and body of the DTMOS structures. The capacitive coupling combines with the junction capacitance of the structure to form a capacitive voltage divider between the drain and body. This provides an ability to operate DTMOS structures above 0.6–0.8 volts resulting in increased switching speeds. Additionally, capacitive coupling mitigates dropping of body potential during switching by lowering the threshold voltage of the structure. Body potential and threshold potential are related-by controlling body potential,—dropping of body voltage during switching is mitigated, which in turn mitigates variances in the threshold voltage.

A multiple DTMOS system is formed by using a shared heavily doped region alongside abutting transistor structures. A single heavily doped region may be employed for multiple transistor structures or several heavily doped regions may be employed between abutting transistor structures. This provides a capacitive junction between the gate and body of each transistor structure resulting in improved performance of the system. Additionally, the source of one abutting device can be formed from the same doped region of the drain of the other abutting device. Sharing regions provides reduced cost in material and reduced device size and ultimately a faster device.

One aspect of the invention relates to a multiple MOSFET device structure. The structure comprises a plurality of MOSFET devices sharing at least one heavily doped region extending underneath a gate region of at least two of the plurality of MOSFET devices. The shared heavily doped region provides a capacitive coupling forming a capacitive voltage divider with the junction capacitance of the MOSFET devices between a body region and the gate region.

Another aspect of the device relates to a multiple transistor device. The multiple transistor device comprises a plurality of transistor devices. Each of the plurality of transistor devices comprises an $N^+$ source region and an $N^-$ lightly doped source region, an $N^+$ drain region and an $N^-$ lightly doped drain region and a $P^{++}$ heavily doped region. The $P^{++}$ heavily doped region resides alongside at least a portion of one of the $N^-$ lightly doped source region and the $N^-$ lightly doped drain region of each of the plurality of transistor devices. A $P^+$ body region resides below a gate region and between the source and drain regions of each of the plurality of transistor devices. The $P^{++}$ heavily doped region provides a capacitive coupling forming a capacitive voltage divider with the junction capacitance of the device between the body region and the gate of each of the plurality of transistor devices.

Yet another aspect of the device relates to an SOI multiple NMOS structure comprising a silicon substrate, an insulating oxide layer formed over the substrate, a top silicon layer formed over the insulating oxide layer, a plurality of gates formed over a portion of the top silicon layer, each of the plurality of gates corresponding to an NMOS structure, a gate oxide formed between the plurality of gates and the top silicon layer, $N^+$ source and $N^+$ drain regions formed in the top silicon layer for each of the multiple structures, $N^-$ lightly doped source and drain extension regions formed in the top silicon layer for each of the multiple structures, a $P^{++}$ heavily doped region formed along the length of the top silicon layer extending beneath the plurality of gates, the $P^{++}$ regions having higher dopant concentration than the $N^+$ regions and residing alongside a portion of the respective $N^-$ regions, wherein the $P^{++}$ region provide a capacitive coupling between a body region and a gate for each of the NMOS structures and form a capacitive voltage divider with the junction capacitance of each of the NMOS structures.

Another aspect of the present invention relates to a multiple DTMOS structure. The multiple DTMOS system comprises at least two abutting DTMOS structures each comprising: a source region, a drain region, a gate region and a body region, and a capacitance formed underneath the gate regions and alongside at least one of the source region and the drain region of the at least two abutting DTMOS structures.

Still another aspect of the invention relates to a method of forming a multiple MOSFET structure. The method comprises the steps of forming lightly doped regions in a substrate, forming the same number of source and drain regions as lightly doped regions in the substrate, the source and drain regions being at least partially below the corresponding lightly doped regions and at least one of the source and drain regions being shared between abutting MOSFET structures and forming a highly doped region adjacent to the lightly doped regions.

Another aspect of the present invention relates to a method of forming an SOI multiple NMOS structure, comprising the steps of using a SIMOX process to form a silicon base, an oxide layer between the base and a top silicon layer, forming $N^-$ lightly doped regions in the top silicon layer, forming the same number of $N^+$ source and drain regions as the lightly doped regions in the top silicon layer, the source and drain regions being at least partially below a corresponding lightly doped region and forming a $P^{++}$ heavily doped region extending alongside the $N^-$ lightly doped regions and the $N^+$ source and drain regions in the top silicon layer wherein the $P^{++}$ region provide a capacitive coupling between a body region and a gate of at least one of the multiple NMOS structures and forms a capacitive voltage divider with the junction capacitance of the NMOS structure.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
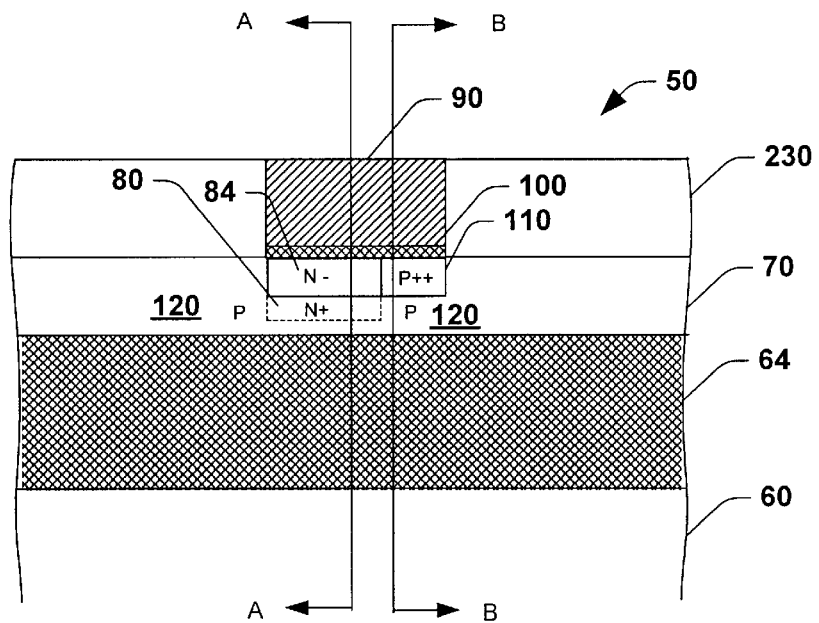
FIG. 1a is a schematic cross-sectional side view illustration of a multiple DTMOS SOI structure in accordance with the present invention.

The present invention relates to a multiple MOSFET system which facilitates mitigation of junction capacitance and/or floating body effects, and a method for making the same. The multiple MOSFET system of the present invention exhibits faster performance, lower power consumption and less hysteresis than many conventional multiple MOSFET systems. The present invention accomplishes such by providing a capacitive coupling of a gate region and a body region of at least one of the MOSFET structures of the system to configure the structure as a dynamic threshold metal oxide field effect transistor (DTMOS). The capacitive coupling forms a capacitive voltage divider with the junction capacitance of the device to allow the device to operate above 0.6–0.8 volts. The capacitive coupling can be provided in the other MOSFET structures by sharing heavily doped regions between abutting structures. The present invention will now be described with reference to the drawings, wherein like reference numerals are used to refer to like elements throughout. Although the present invention is described primarily in connection with an SOI multiple MOSFET structure, the present invention may be employed in connection with bulk multiple MOSFET structures as well. It should be understood that the description of this preferred embodiment is merely illustrative and that it should not be taken in a limiting sense.

Figure 1B:
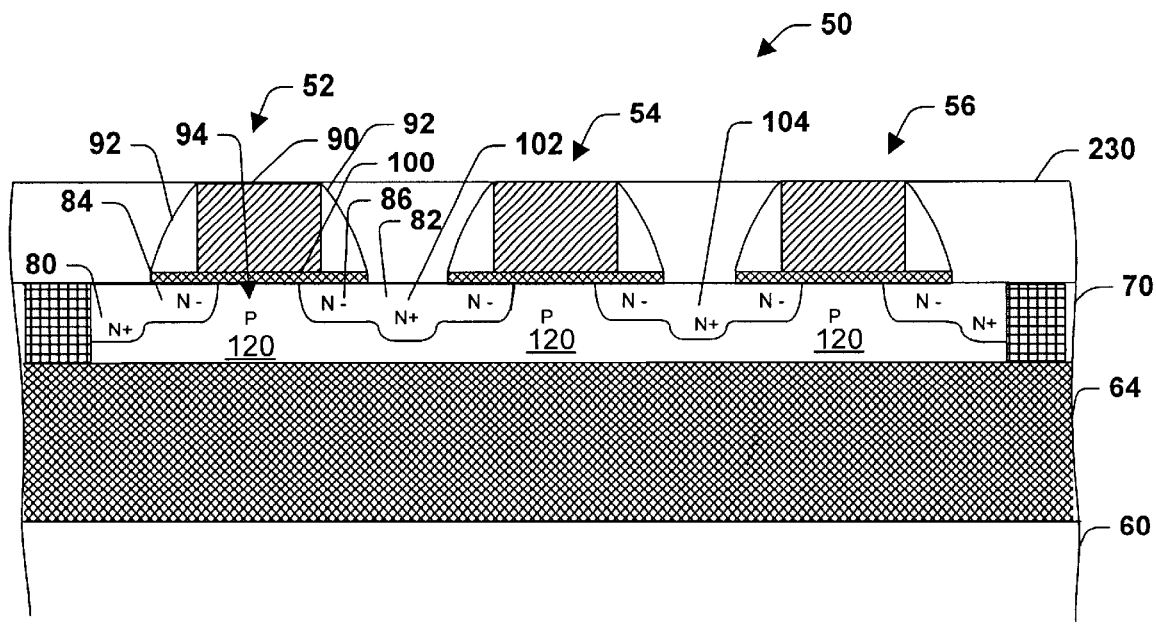
FIG. 1b is a schematic cross-sectional view illustration of the multiple DTMOS SOI structure of FIG. 1a along the lines A—A in accordance with the present invention.
Figure 1C:
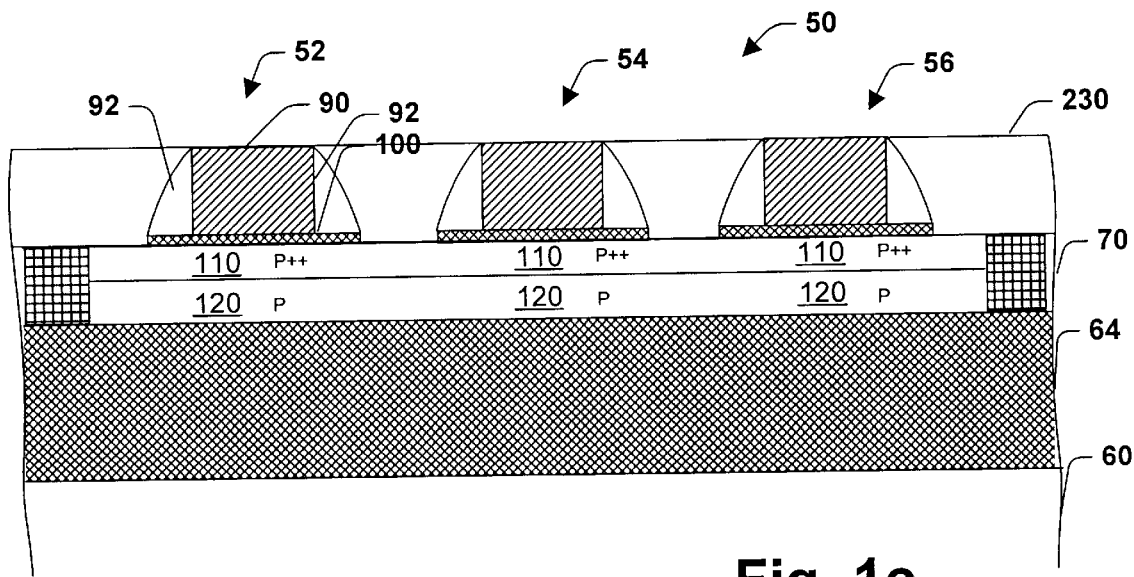
FIG. 1c is a schematic cross-sectional view illustration of the multiple DTMOS SOI structure of FIG. 1a along the lines B—B in accordance with the present invention.

FIG. 1a is a schematic cross-sectional side view illustration of a SOI multiple MOSFET device structure 50 across a central region in accordance with the present invention. The structure 50 includes a first MOSFET structure 52, a second MOSFET structure 54 and a third MOSFET structure 56 (FIGS. 1b–1c). The device structure 50 includes a base 60 comprising silicon, for example. The base 60 provides mechanical support for the device structure 50, and is of a thickness suitable for providing such support. A dielectric layer 64 (e.g., $SiO_2$, $Si_3N_4$) is formed over the base 60. The thickness of the dielectric layer 64 is preferably within the range of 1000 Å to 5000 Å. A top silicon layer 70 is shown formed over the dielectric layer 64, and the top silicon layer preferably has a thickness within the range of 500 Å to 2000 Å. The top silicon layer 70 becomes the active region for device fabrication. Each MOSFET device 52, 54 and 56 include a gate 90, an n-type channel 94 (FIGS. 1b–1c), and a gate oxide layer 100 formed between the gate 90 and the channel 94. An oxide layer 230 serves to protect the device 50 from contaminants, etc. FIG. 1b is a schematic cross-sectional illustration of the SOI multiple MOSFET device structure 50 along the lines A—A of FIG. 1a in accordance with the present invention. Each MOSFET device 52, 54 and 56 is an NMOS type device. Connections and vias (not shown) can be implemented to form various circuit configurations (e.g, NAND gate, NOR gate). It is to be appreciated that although each of the structures 52, 54 and 56 are NMOS devices, a number of NMOS and PMOS devices can be employed to form a variety of circuit configurations by employing the present invention. Each MOSFET device 52, 54 and 56 include an $N^+$ drain region 80, an $N^+$ source region 82, an $N^-$ lightly doped drain extension region 84, and an $N^-$ lightly doped source extension region 86. Alongside the $N^+$ drain region 80, the $N^-$ lightly doped drain extension region 84, the $N^+$ source region 82, and the $N^-$ lightly doped source extension region 86 of each MOSFET device 52, 54 and 56 is a heavily doped $P^{++}$ region 110 that extends across the entire MOSFET device structure 50 under the gates 90 of the MOSFET devices 52, 54 and 56 (see FIGS. 1a and 1c).

FIG. 1c illustrates a cross-sectional view of the device structure 50 along the lines B—B of FIG. 1a. The heavily doped region 110 is a shared region that forms a capacitance between the gate 90 and the body 120 of each of the MOSFET devices 52, 54 and 56, coupling the gate 90 to the body 120 and forming a capacitive voltage divider with the junction capacitance of the device. The heavily doped region 110 also facilitates voltage control of floating body effects (e.g., kink effect and hysteresis effects) of the devices 52, 54 and 56. As can be seen from FIGS. 1a–1c, the heavily doped $P^{++}$ region 110 runs under the gate 90 alongside the transistor $N^+$ drain region 80 and $N^-$ lightly doped drain extension region 84 for each device 52, 54 and 56. The heavily doped $P^+$ region 110 also runs under the gate 90 alongside the transistor $N^+$ source region 82 and $N^-$ lightly doped source extension region 86 for each device 52, 54 and 56.

It is to be appreciated that although the present example is illustrated with respect to a single heavily doped region shared between a plurality of MOSFET devices, a shared heavily doped region may be provided between each abutting structure or multiple shared heavily doped regions may be provided between abutting structures.

Lowering the doping concentration of the source/drain regions reduces the junction capacitances between the drain/body and source/body interfaces. The junction capacitance is related to the doping concentrations of the regions forming the junction, as can be seen from the following formula:

$$C_j = \epsilon A[(q/2\epsilon(V_o-V))(N_aN_d/(N_a+N_d))]^{1/2}$$

wherein A represents the cross sectional area of the source/body and drain/body interfaces, $N_d$ represents the number of donors in the source and drain regions, respectively, and $N_a$ represents the number of acceptors in the body The heavily doped region is doped with a $P^+$ type dopant (e.g., Boron) and at a dopant concentration higher than the $N^+$ dopant concentration of the source/drain regions 80, 82 and the $P^+$ body region 120. As a result, the heavily doped region 110 forms a capacitance between the gate 90 and the body 120 for each device 52, 54 and 56 which couples the gate 90 to the body 120 and serves to act as a voltage divider. This allows use of each of the NMOS devices as DTMOS devices that can operate at voltages higher than a diode drop.

In one specific embodiment of the present invention, heavily doped region 110 preferably include a boron implant having a dose within the range of $1\times10^{18}$ to $1\times10^{20}$ atoms/$cm^2$ at an energy range of about 1 KeV to about 100 KeV. The lightly doped source/drain extension regions include an arsenic implant having a dose concentration in the range of $1\times10^{14}$ to $1\times10^{16}$ atoms/$cm^2$ and implanted at an energy range of about 50 KeV to about 200 KeV. The source and drain regions 80, 82 include an arsenic or phosphorus implant having a dose within the range of $1\times10^{17}$ to $1\times10^{17}$ atoms/$cm^2$ at an energy range of about 50 KeV to about 200 KeV. It will be appreciated that any suitable dose and energy range and implant may be employed to carry out the present invention. The p-type body 120 includes a $P^+$ implant (e.g., Boron) having a dose within the range of $1\times10^{10}$ to $1\times10^{14}$ atoms/$cm^2$.

Figure 1D:
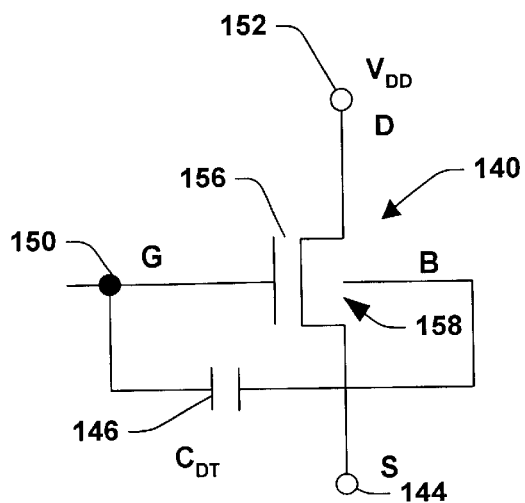
FIG. 1d is a schematic illustration of an equivalent circuit of one of the multiple DTMOS devices of the multiple DTMOS SOI structure of FIGS. 1a–1c in accordance with the present invention.
Figure 1E:
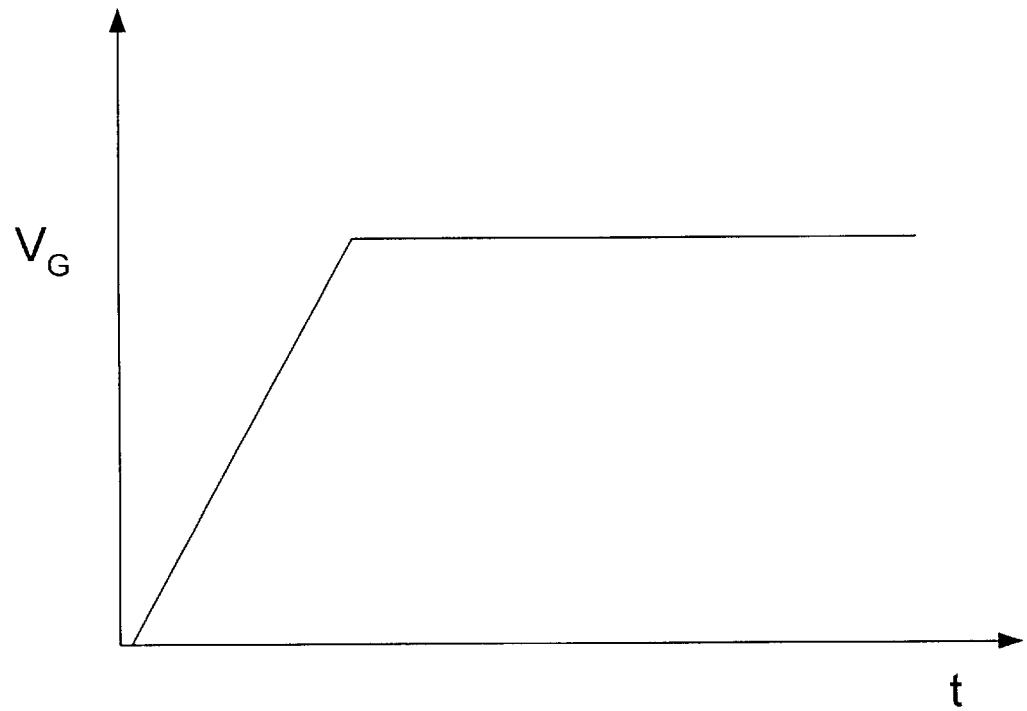
FIG. 1e is a graph illustrating gate voltage verse time of one of the multiple DTMOS devices of the multiple DTMOS SOI structure of FIGS. 1a–1c in accordance with the present invention.
Figure 1F:
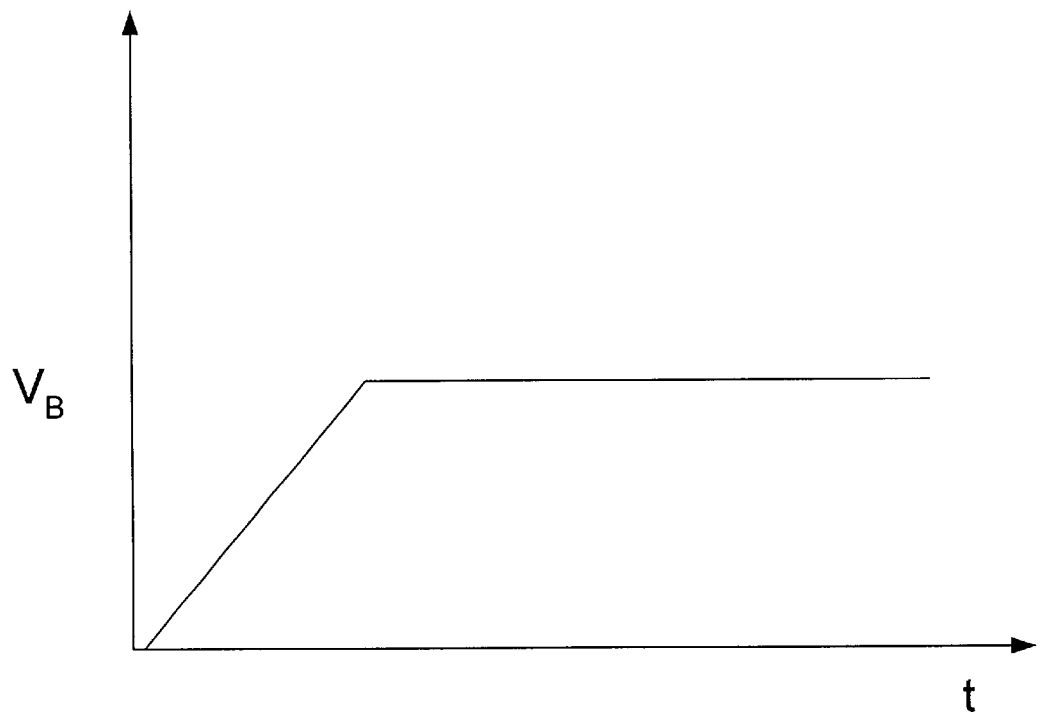
FIG. 1f is a graph illustrating body voltage verse time of the DTMOS SOI structure of FIGS. 1a–1f corresponding to the gate voltage illustrated in FIG. 1c in accordance with the present invention.

FIG. 1d illustrates a schematic diagram of an equivalent circuit for each of the MOSFET devices 52, 54 and 56. The equivalent circuit includes a MOSFET device 140 having a gate region 156, a body region 158, a source 144 and a drain 152. A capacitor 146 labeled as $C_{DT}$ is connected from the body region 158 to the gate region 156 via a contact point 150. The capacitor 146 combines with the junction capacitance Cj of the MOSFET 140 to form a voltage divider between voltage applied to the gate region of the MOSFET 140 and the voltage level at the body region 158 of the MOSFET structure 50. The voltage level at the body region 158 is proportional to the voltage applied at the gate region 156 and is governed by the following equation:

$$\Delta V_B = (C_{DT}/C_{DT}+Cj)^*\Delta V_G$$

where Cj is the junction capacitance of the MOSFET 140. FIGS. 1e–1f illustrate the relationship of $V_G$ and $V_B$ over time where $V_B$ (max) is proportional to $V_G$ but less than $V_{DD}$ as determined by the capacitive ratio illustrated in the above equation.

In forming multiple structure systems, the present invention provides shared doped regions between abutting structures. For example, the $P^+$ heavily doped region 110 is shared between the first MOSFET device 52, the second MOSFET device 54 and the third MOSFET device 56. However, separate $P^{++}$ heavily doped regions may be provided between abutting devices. Abutting devices can also include a shared $N^+$ region 102 and 104. For example, the $N^+$ source region 82 of the first MOSFET structure 52 and the $N^+$ drain region 80 of the second MOSFET structure 54 form a shared $N^+$ region 102. Furthermore, the $N^+$ source region 82 of the second MOSFET structure 54 and the $N^+$ drain region 80 of the third MOSFET structure 56 form a shared $N^+$ region 104. Providing shared regions between structures increases the speed of the system 50, reduces material costs and reduces the overall size of the system 50.

Figure 2:
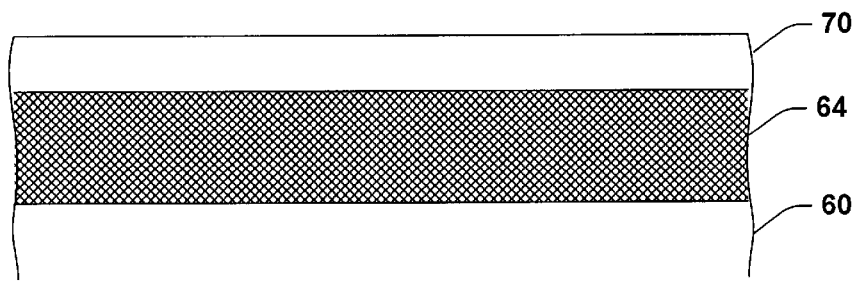
FIG. 2 is a schematic cross-sectional illustration of an SOI substrate in accordance with the present invention.

Turning now to FIGS. 2–20, fabrication steps in connection with forming the structure 50 of FIG. 1a are discussed. FIGS. 2–11 illustrates the fabrication of the structure 50 with respect to the cross-sectional view as shown in FIG. 1c and FIGS. 12–20 illustrate the fabrication of the structure 50 with respect to the cross-sectional view as shown in FIG. 1b. FIG. 2 illustrates a basic SOI structure in its early stages of fabrication. The structure includes the silicon base 60, the silicon oxide layer 64 and the top silicon layer 70. This basic structure is formed preferably via a SIMOX (Separation by Implantation of Oxygen) process. The basic steps of the SIMOX process involve implanting oxygen beneath the surface of a silicon wafer. An annealing step is next performed to coalesce the implanted oxygen atoms into a uniform layer of $SiO_2$. Sometimes, epitaxial silicon may be grown atop the silicon to satisfy specific device requirements, but with or without an epitaxial layer, the top surface film 70 becomes the active region for device fabrication. The buried oxide layer 64 is typically 0.1 to 0.5 μm thick and exhibit almost complete incorporation of the implanted oxygen. Typical implant energies range from 150 to 200 keV, while the oxygen dose may vary from 1 to 2E18 $cm^{-2}$. The top silicon film 70 thickness as well as the variation thereof with respect to the oxide layer 64 thickness is a function of the implant energy as well as the rate of surface silicon sputtering during the implant process.

A second significant step in the SIMOX process is high temperature annealing Such annealing is typically performed at temperatures greater than 1250° C. for several hours to coalesce the implanted oxygen and achieve solid state recrystallization of the top (superficial) silicon layer 70 from the surface downward.

FIGS. 3–8 illustrate process steps associated with fabrication of isolation regions of the MOSFET device 50 in accordance with the present invention. The present process relates to shallow trench isolation (STI), which involves etching a trench into the top silicon layer 70 and filling the trench with an isolation material. Local oxidation of silicon (LOCOS) isolation processes generally occupy a great deal of wafer surface area, and thus STI provides for an alternative isolation technique.

Figure 3:
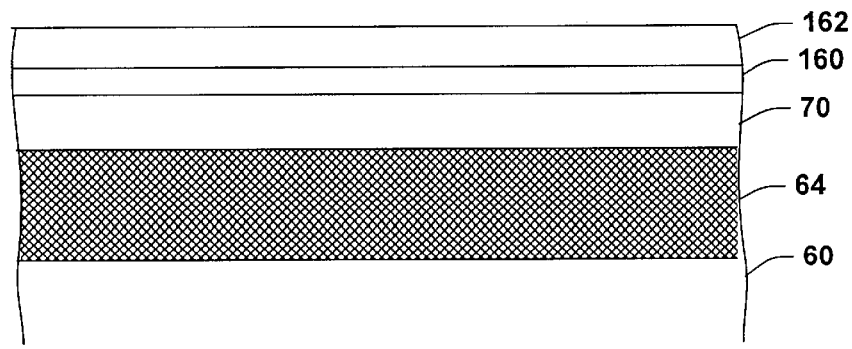
FIG. 3 is a schematic cross-sectional illustration of the SOI substrate of FIG. 2 with a pad oxide layer and nitride layer formed thereon in accordance with the present invention.
Figure 4:
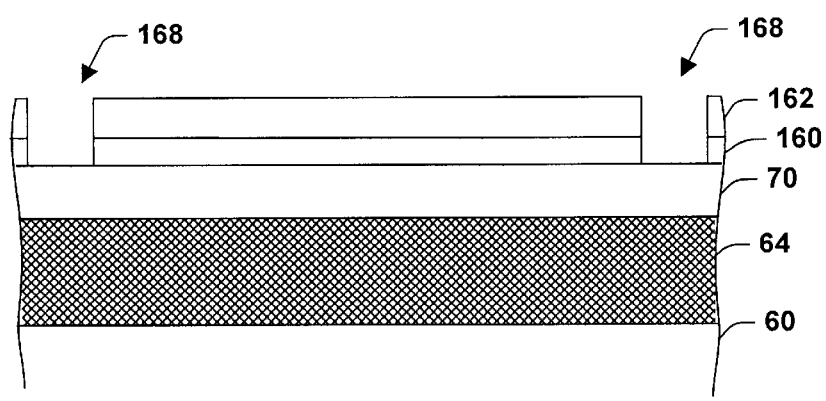
FIG. 4 is a schematic cross-sectional illustration of the structure of FIG. 3 with isolation regions formed therein in accordance with the present invention.

FIG. 3 illustrates a pad oxide layer 160 and a layer of nitride 162 formed on the surface of the top silicon layer 70. The pad oxide layer 160 has a thickness of approximately 200 Å and may be thermally grown at a temperature of approximately 900° C. for a period of 40 minutes. The nitride layer 162 is deposited on the surface of the pad oxide layer 160 via a chemical vapor deposition (CVD) process to a thickness of approximately 2000 Å. A conventional photoresist process is then utilized to pattern and etch the nitride layer 162 and the pad oxide layer 160 in order to result in the structure shown in FIG. 4. Such photoresist process includes use of an STI mask which defines isolation regions 168. The isolation regions 168 are located on the substrate 60 at positions which will interpose active regions later formed on the top silicon layer 70.

Figure 5:
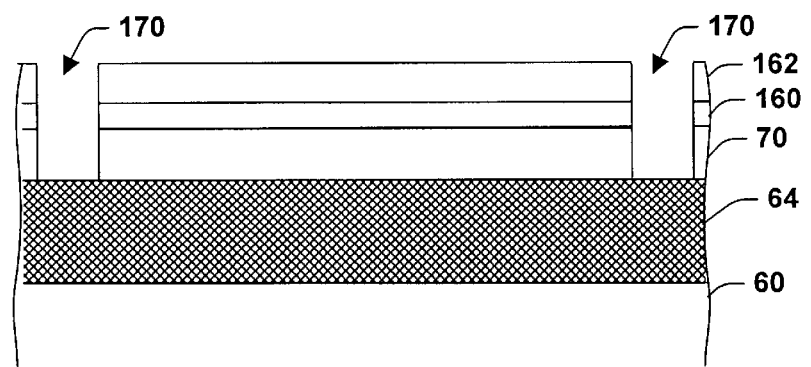
FIG. 5 is a schematic cross-sectional illustration of the structure of FIG. 4 with shallow isolation trenches formed at the isolation regions in accordance with the present invention.

Next, as represented in FIG. 5, a silicon etch is performed so as to form shallow trenches 170 within the top silicon layer 70 at the isolation regions 168. In particular, a trench resist material (not shown) is applied to cover the structure and is then patterned to expose the isolation regions 168. The shallow trenches 170 are then etched into the top silicon layer 70 using suitable techniques. The trench resist material is thereafter stripped so as to result in the structure shown in FIG. 5.

Figure 6:
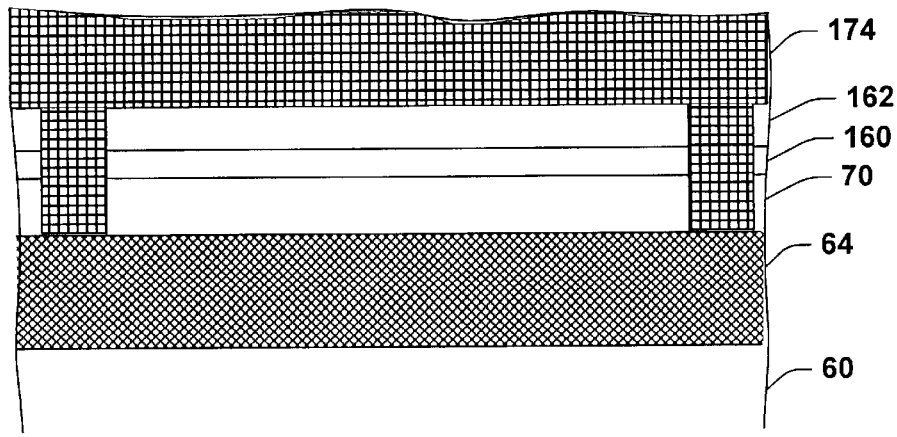
FIG. 6 is a schematic cross-sectional illustration of the structure of FIG. 5 with an oxide layer formed thereon so as to fill the isolation trenches in accordance with the present invention.
Figure 7:
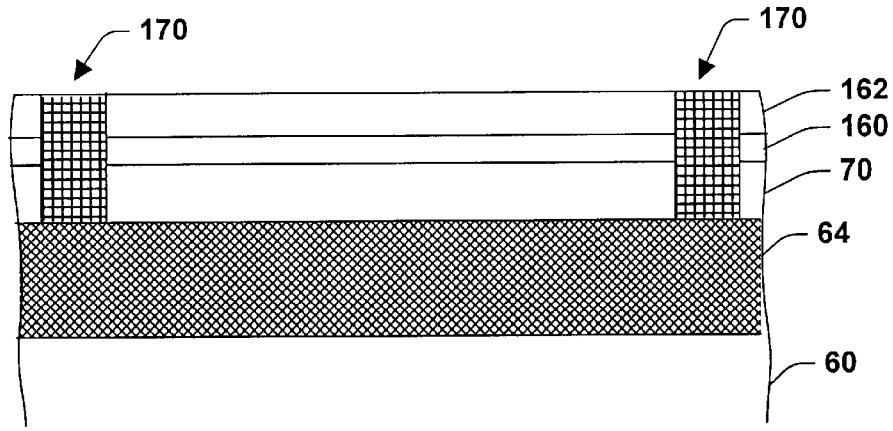
FIG. 7 is a schematic cross-sectional illustration of the structure of FIG. 6 after the oxide layer has been polished down to the surface of the nitride layer in accordance with the present invention.

Following the formation of the trenches 170 via the silicon etch, a layer of oxide material 174 is formed on the structure using high density plasma chemical vapor deposition (HDPCVD) in order to fill fully the isolation regions 170 with the oxide material 174 as shown in FIG. 6. As is known, HDPCVD is a self-planarizing process which facilitates reduction of the chemical mechanical polishing (CMP) times required in subsequent steps. (See, e.g., Pye, J. T. et al., *High-density plasma CVD and CMP for 0.25-μm intermetal dielectric processing*, Solid State Technology, December, 1995, pgs. 65–71). Following deposition of the oxide material 174, the oxide material 174 is polished via CMP down to the surface level of the nitride layer 162 as shown in FIG. 7. Consequently, the insulative oxide material 174 in the trenches 170 remains. The upper surface of the oxide material 174 is substantially even with the upper surface of the nitride layer 162.

Figure 8:
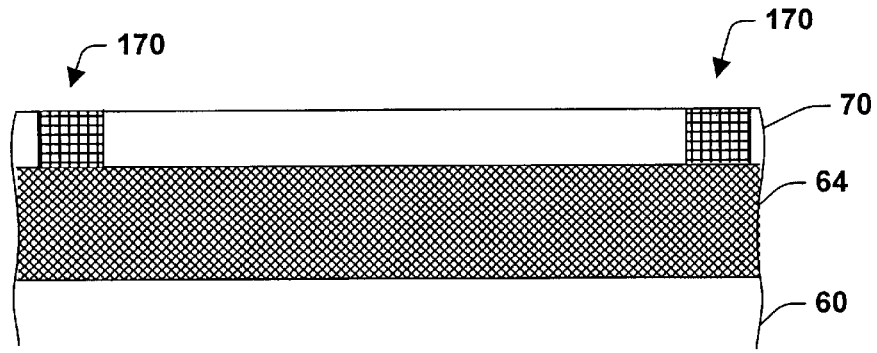
FIG. 8 is a schematic cross-sectional illustration of the structure of FIG. 7 after the nitride layer, pad oxide layer and portions of the oxide layer have been etched away in accordance with the present invention.

As is represented in FIG. 8, the nitride layer 162 and pad oxide layer 160 are stripped away using a suitable stripping process. The strip process also results in the top surface of the oxide material 174 being etched to a level substantially even with the surface of the top silicon layer 70. Thus, the formation of the shallow isolation trenches 170 is substantially complete in relevant part.

Turning now to FIGS. 9–20, process steps in connection with completion of the MOSFET device 50 in accordance with the present invention are described. Although the present invention is described in the context of fabricating NMOS type devices it is to be appreciated that the present invention as applicability to a variety of transistor devices including PMOS type devices. The present description will enable those skilled in the art to practice the invention with respect to a vast number of different types of transistor devices which are intended to fall within the scope of the invention as defined by the hereto appended claims.

Figure 9:
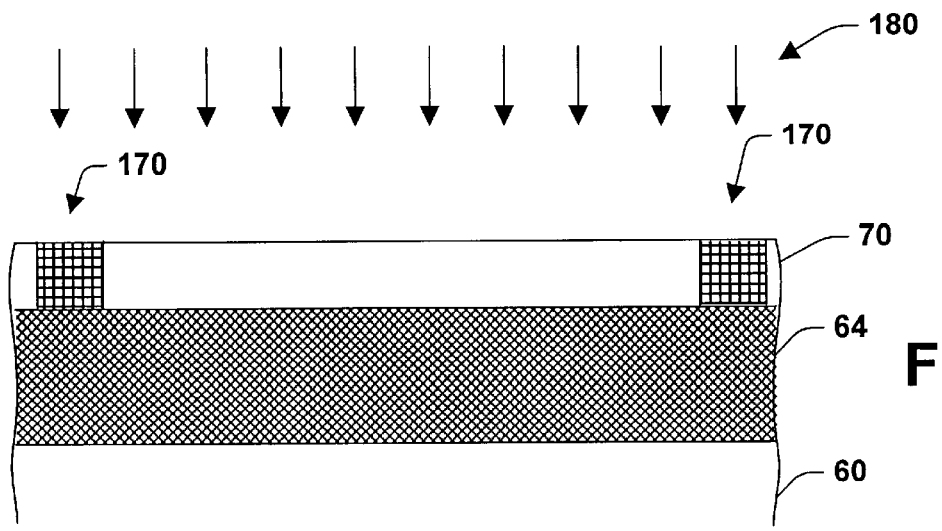
FIG. 9 is a schematic cross-sectional illustration of the structure of FIG. 8 undergoing an ion implant step to form a p-type body region in accordance with the present invention.
Figure 10:
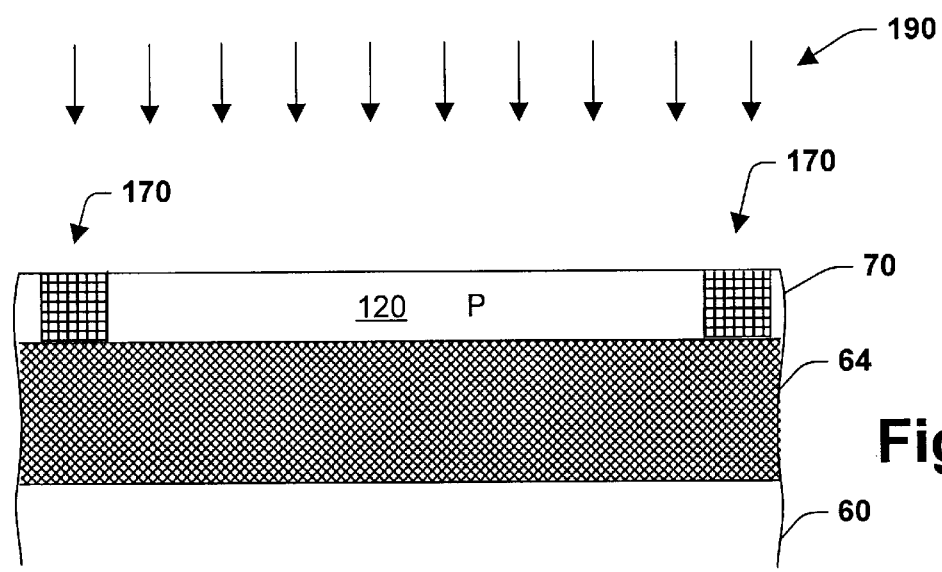
FIG. 10 is a schematic cross-sectional illustration of the structure of FIG. 9 undergoing an ion implant step to form a heavily doped region in accordance with the present invention.
Figure 11:
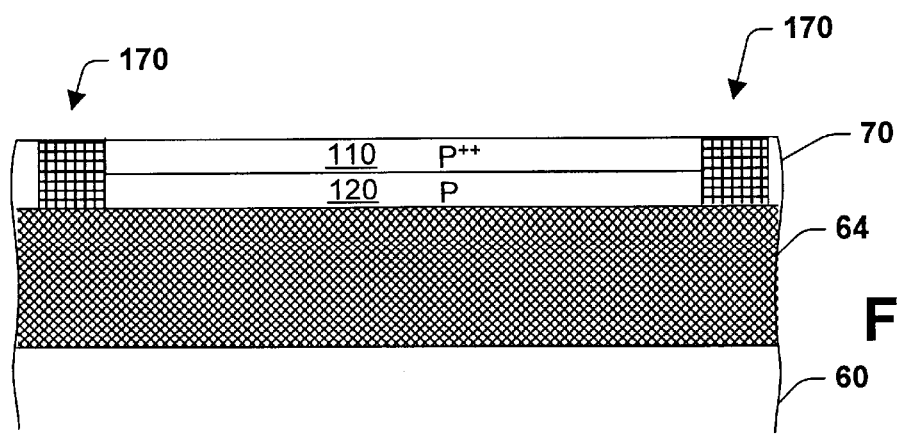
FIG. 11 is a schematic cross-sectional illustration of the structure of FIG. 10 after undergoing the ion implant step to form a heavily doped region in accordance with the present invention.

The top silicon layer 70 is of a p-type and the trenches 170 serve as isolation barriers to define active regions. FIG. 9 shows the formation of the p-type body 120 by masking a portion of the top silicon layer 70 with a photoresist layer (not shown) and implanting p-well dopants 180 to provide the p-type body 120. Turning now to FIG. 10, a second implant step 190 is performed to implant $P^{++}$ implants at a higher dose than the p-type body implant of step 190 to achieve the highly doped region 110. A special mask is employed to ensure that the p-type implant only implants the structure in a specific region of the device 50. The $P^{++}$ implant of step 190 is preferably Boron at a dopant concentration within the range of about $1\times10^{18} - 1\times10^{19}$ atoms/cm$^3$. The $P^{++}$ implant provides a capacitive coupling of a gate region and a body region of the MOSFET device to configure the device as a dynamic threshold metal oxide field effect transistor (DTMOS). FIG. 11 illustrates the capacitance portion of the structure 50 completed in relevant part.

Figure 12:
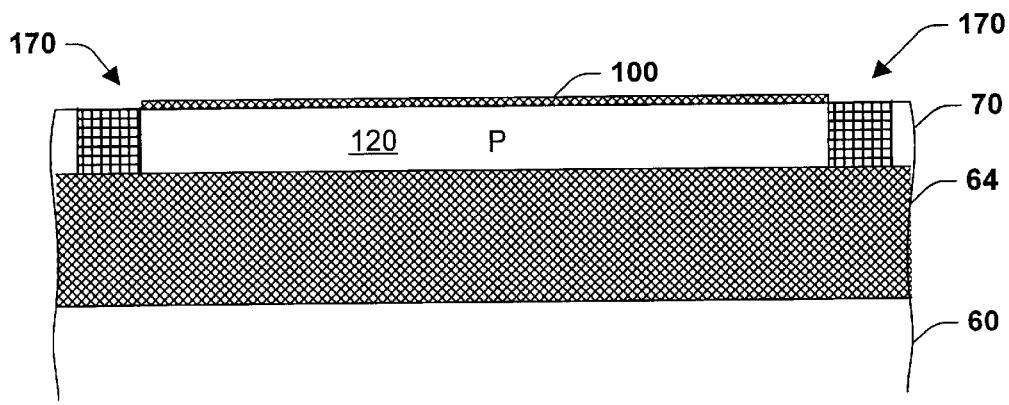
FIG. 12 is a schematic cross-sectional illustration of the structure of FIG. 11 with a thin low dielectric constant gate oxide material formed on the substrate surface between the isolation trenches in accordance with the present invention.

FIGS. 12–20 illustrate a cross-sectional view of the formation of the transistor portion of the device structure 50 as shown in FIG. 1b. FIG. 12 illustrates the thin gate oxide material 100 being laid down on the top silicon layer 70 between the shallow trenches 170. The thin gate oxide material 100 is formed to have a thickness within the range of about <40 Å. Preferably, the thin gate oxide material 100 includes $SiO_2$ which has a substantially low dielectric constant. However, it is to be appreciated that any suitable material (e.g., $Si_3N_4$) for carrying out the present invention may be employed and is intended to fall within the scope of the present invention. Alternatively, the thin gate oxide material 100 can be formed prior to the formation of the heavily doped region 110.

Figure 13:
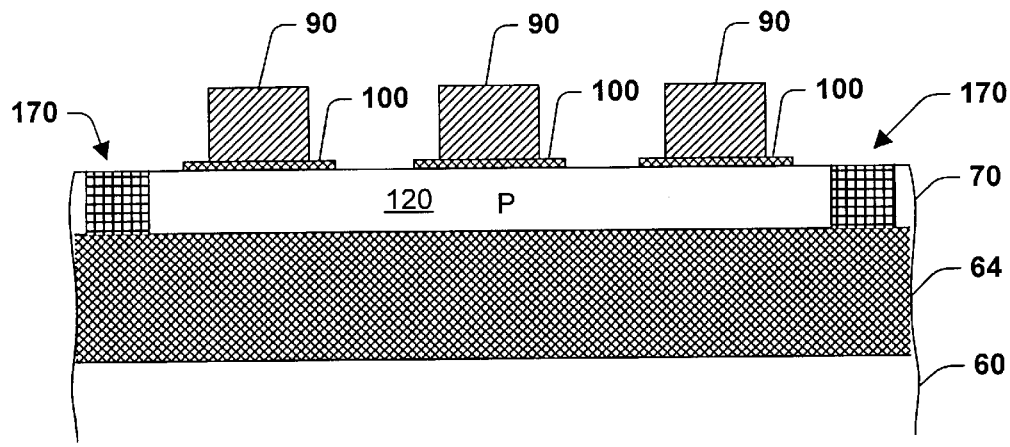
FIG. 13 is a schematic cross-sectional illustration of the structure of FIG. 12 after formation of a plurality of gates in accordance with the present invention.

Thereafter as shown in FIG. 13, the gate structure 90 for each MOSFET device is formed between the shallow trenches 170 over the thin gate oxide material 100. The gate 90 is made of polysilicon. The gate 90 has a thickness within the range of about 1000 to 2000 Å, and the thickness of the gate 90 is chosen so as to account for any subsequent polishing that might be performed. It will be appreciated of course that the thickness of the thin gate oxide material 100 and the gate 90 may be tailored as desired and the present invention intends to include any suitable range of thicknesses thereof for carrying out the present invention. Excess gate oxide material 100 is removed as is conventional.

Figure 14:
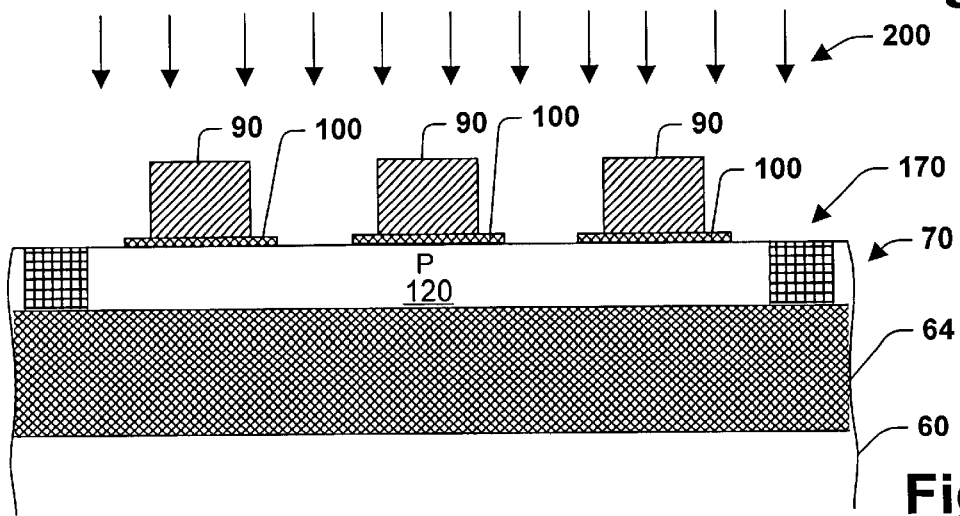
FIG. 14 is a schematic cross-sectional illustration of the structure of FIG. 13 undergoing an ion implant step to form N⁻ source/drain (S/D) lightly doped regions in accordance with the present invention.
Figure 15:
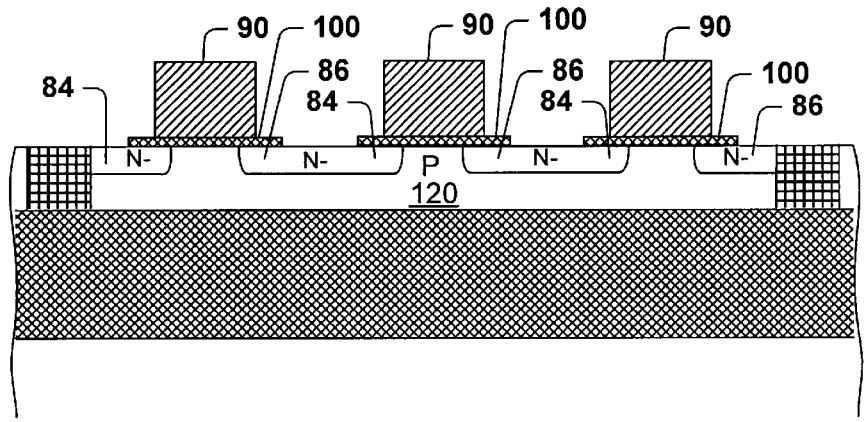
FIG. 15 is a schematic cross-sectional illustration of the structure of FIG. 14 after undergoing the ion implant step to form N source/drain (S/D) lightly doped regions in accordance with the present invention.

FIG. 14 illustrates an n-region first ion implant step 200. A capacitor mask is employed to protect the highly doped P$^{++}$ regions during the n-type implants. A N$^-$ implant 200 is used to form n-channel transistor lightly doped regions 84 and 86 (FIG. 15) for each MOSFET transistor device which are self-aligned with the gate 90, respectively. In the preferred embodiment, this implant step may be an arsenic implant for example having a dose in the range of $1\times10^{14}$ to $1\times10^{16}$ atoms/cm$^2$ and an energy range of about 50 KeV to about 200 KeV. It will be appreciated that any suitable dose and energy range and implant may be employed to carry out the present invention.

Next, after the step of implanting arsenic, an optional nitrogen implant step may be performed as part of implant step 200. Nitrogen may be added via implantation in the lightly doped regions 84 and 86. The nitrogen implant may be applied at a dose of $1\times10^{14}$ to $5\times10^{15}$ atoms/cm$^2$ with an energy range of about 50 KeV to 200 KeV. It will be appreciated that although in the preferred embodiment the nitrogen implant step is performed after the arsenic implantation, the nitrogen implantation may be performed prior to the arsenic implantation.

The implantation of the nitrogen as represented results in reduced series resistance and hot carrier effects without significantly increasing S/D extension overlap. Contrary to conventional MOS fabrication techniques where increasing dopant concentration results in lower sheet resistance, the nitrogen implantation does not result in a deeper junction as a result of the increase in dopant. On the other hand, if the arsenic dopant dose is increased in order to lower sheet resistance, a deeper junction would result. The deeper junction may result in bad roll-off, make the MOS device more difficult to control, and possibly result in punch through effects. However, unlike conventional techniques, the nitrogen implantation results in reduced series resistance. Thus, this step provides for reducing series resistance without the negative consequences (e.g., hot electron carrier and punch through effects) associated with conventional techniques.

Furthermore, the nitrogen implantation does not result in any significant increase in the amount of diffusion of the S/D extension into the gate. When an implant is provided in the S/D extension region the implant not only spreads vertically there is also horizontal spreading of the implant which is known as S/D extension overlap into the gate. The use of nitrogen implant does not result in any significant increase in S/D extension overlap as compared to conventional dopants.

Figure 16:
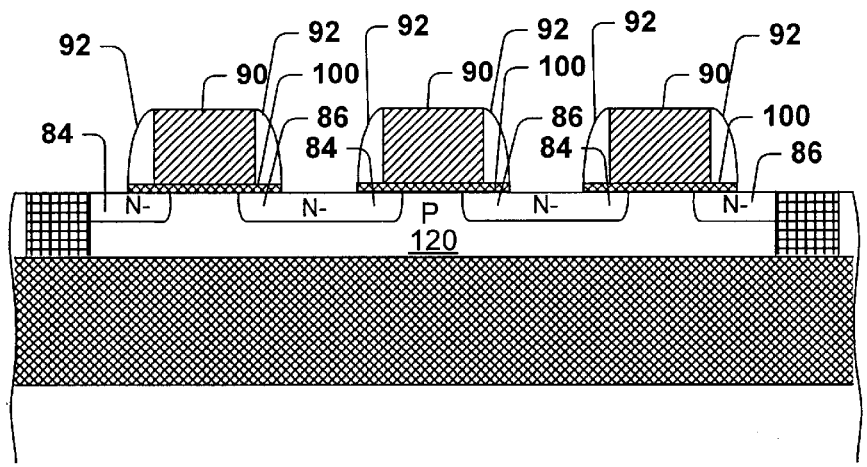
FIG. 16 is a schematic cross-sectional illustration of the structure of FIG. 15 after the formation of spacers in accordance with the present invention.

After the implant step 200, the spacers 92 are formed along sidewalls of the gates 90. To accomplish this step, a spacer material layer (not shown) may be formed over the top silicon layer 70. The spacer material layer may be formed by depositing tetraethoxysilane (TEOS) oxide, silicon dioxide or the like over the surface of the top silicon layer 70. The spacer material is then anisotropically etched to form the spacers 92 on the sidewalls of each of the gates 90, for example. An etchant which selectively etches the spacer material layer (e.g., etches the spacer material layer at a faster rate than the top silicon layer 70), may be used to etch the spacer material layer until only the spacers 92 remain at the sidewalls of each of the gates 90 as shown in FIG. 16.

Figure 17:
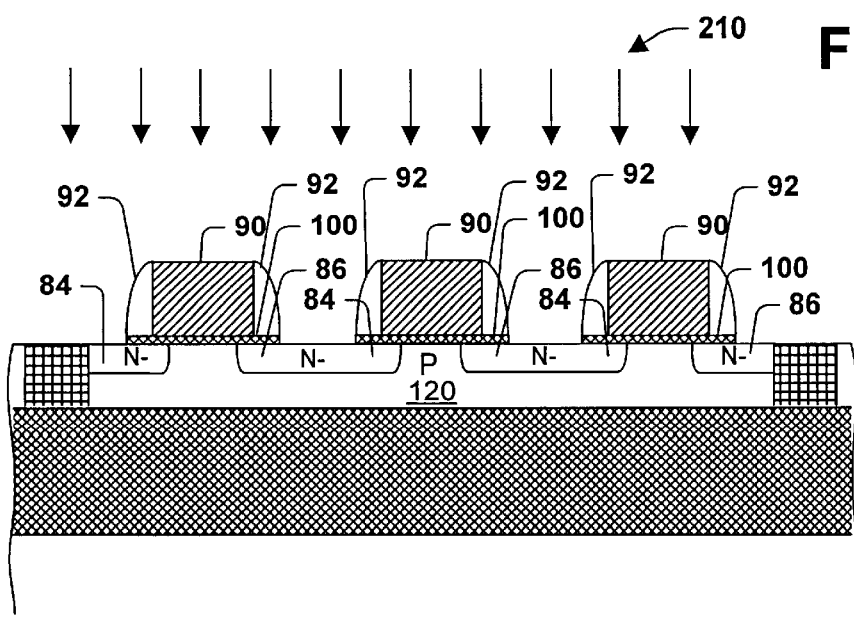
FIG. 17 is a schematic cross-sectional illustration of the structure of FIG. 16 undergoing an ion implant step to form source and drain regions in accordance with the present invention.
Figure 18:
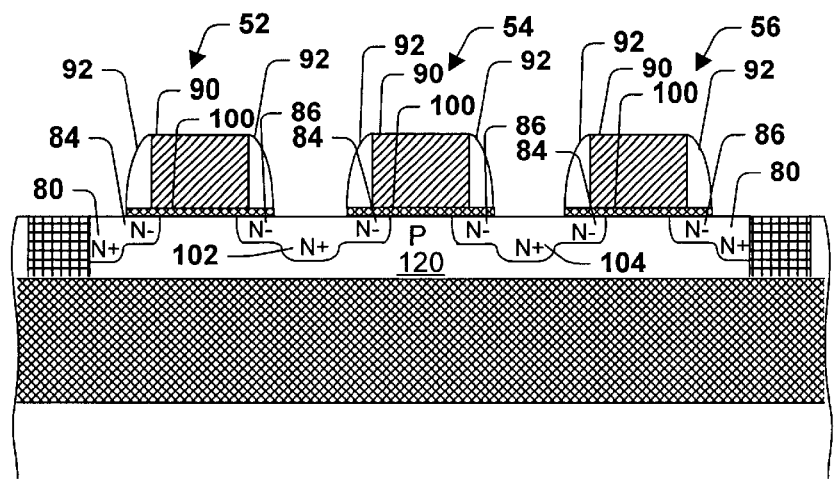
FIG. 18 is a schematic cross-sectional illustration of the structure of FIG. 17 after undergoing the ion implant step to form source and drain regions in accordance with the present invention.

After the formation of the spacers 92 another ion implant step 210 is performed as shown in FIG. 17. A capacitor mask is employed to protect the highly doped P$^{++}$ regions during the n-type implants. An N$^+$ implant 210 is performed to form N$^+$ source region 80 and N$^+$ drain region 82 (FIG. 18) in portions of the lightly doped regions, respectively. The spacers 92 serve as masks to prevent ion implantation in the portions of lightly doped regions underlying the spacers 92. These protected portions of the lightly doped regions are the respective lightly doped drain (LDD) region 84 and lightly doped source (LDS) region 86 of each of the MOSFET devices 52, 54 and 56.

Figure 19:
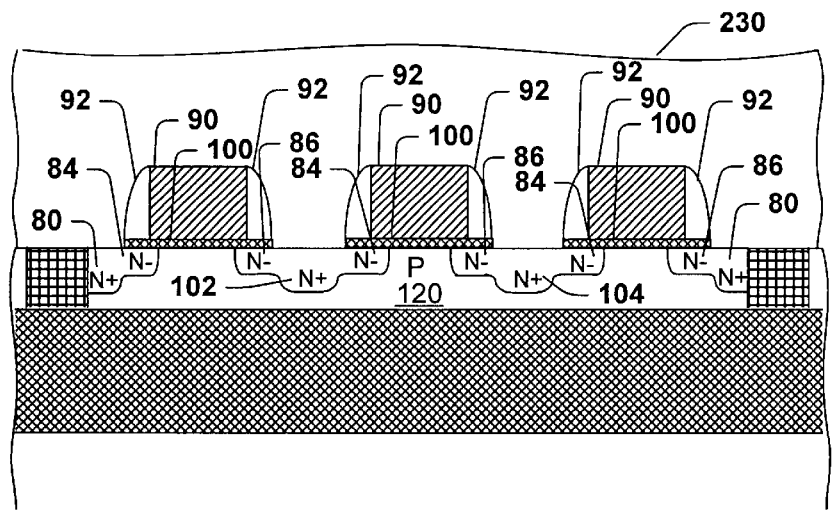
FIG. 19 is a schematic cross-sectional illustration of the structure of FIG. 18 after formation of an oxide layer over the structure in accordance with the present invention.
Figure 20:
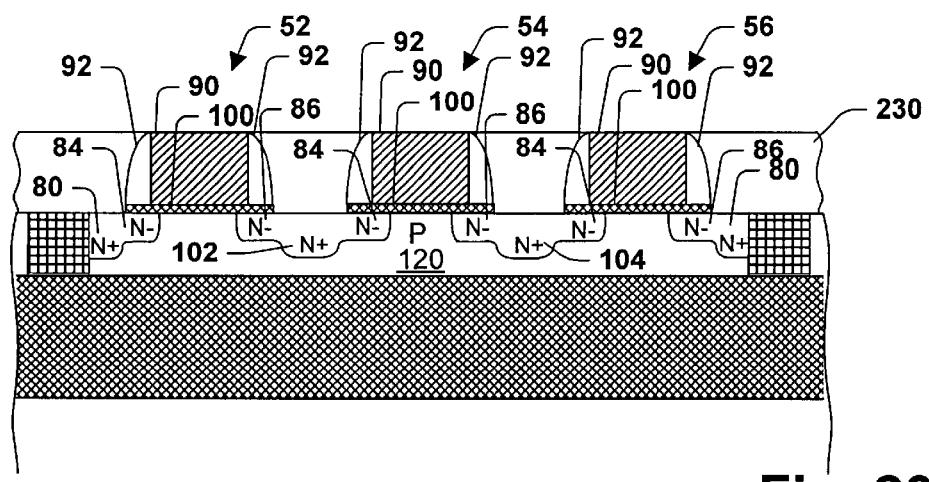
FIG. 20 is a schematic cross-sectional illustration of the structure of FIG. 19 after the oxide layer has been polished down to the surface level of the gate in accordance with the present invention.

Turning now to FIG. 19, an oxide layer 230 is deposited over the MOSFET device 50. The oxide layer 230 is then polished via a chemical mechanical polish (CMP) down to the surface level of the gate 90 as shown in FIG. 20. The upper surface of the oxide layer 230 is thus substantially even with the upper surface of the gate 50. Consequently, the oxide layer 230 serves to mask the entire MOSFET device 50 except for the exposed gate 90. The spacers 92 are no longer depicted because they are of the same material as the oxide layer 230. Thus, the MOSFET device 50 is complete in relevant part.

Substantially the same fabrication methodology may be employed in the fabrication of such an n-channel device as a bulk device as compared to the discussed SOI type device. One skilled in the art could readily tailor the above steps to form such n-channel devices based on the discussion herein, and therefore further discussion related thereto is omitted for sake of brevity.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A multiple MOSFET device structure, comprising:
a plurality of MOSFET devices sharing at least one heavily doped region extending underneath a gate region of at least two of the plurality of MOSFET devices, the shared heavily doped region providing a capacitive coupling forming, a capacitive voltage divider with the junction capacitance of the MOSFET devices between a body region and the gate region.

2. The structure of claim 1, the heavily doped region residing alongside at least a portion of at least one of a lightly doped source extension region and a lightly doped drain extension region of abutting MOSFET devices.

3. The structure of claim 1, the heavily doped region residing alongside at least a portion of at least one of a source region and a drain region of abutting, MOSFET devices.

4. The structure of claim 1, wherein the at least two of the plurality of MOSFET devices each have a lightly doped source extension region and a lightly doped drain extension region having a N$^-$ type implant.

5. The structure of claim 4, wherein the at least two of the plurality of MOSFET devices each have a source region and a drain region, the source region and the drain region having a N$^+$ type implant.

6. The structure of claim 5, the heavily doped region having a P$^{++}$ type implant.

7. The structure of claim 6, the heavily doped region having a dopant concentration higher than the source and drain regions.

8. The structure of claim 7, the device having an SOI substrate and the heavily doped region controlling the floating body effects in the at least two of the plurality of MOSFET devices.

9. A multiple transistor device, comprising:
- a plurality of transistor devices, each of the plurality of transistor devices comprising:
- an $N^+$ source region and an $N^-$ lightly doped source region;
- an $N^+$ drain region and an $N^-$ lightly doped drain region;
- a $P^{++}$ heavily doped region, the $P^{++}$ heavily doped region residing alongside at least a portion of one of the $N^-$ lightly doped source region and the $N^-$ lightly doped drain region of each of the plurality of transistor devices; and
- a $P^+$ body region residing below a gate region and between the source and drain regions of each of the plurality of transistor devices;
- wherein the $P^{++}$ heavily doped region provides a capacitive coupling forming a capacitive voltage divider with the junction capacitance of each of the plurality of transistor devices between the respective gate region and the body region.

10. The device of claim 9, the $P^{++}$ heavily doped region coupling the gate potential with the body potential of each of the plurality of transistor devices.

11. The device of claim 9, the device having an SOI structure wherein the $P^{++}$ region facilitates control of floating body effects.

12. The device of claim 9, the $P^{++}$ heavily doped region having a dopant concentration higher than the $N^+$ source and the $N^+$ drain regions.

13. The device of claim 9, the $P^{++}$ heavily doped region having a dopant concentration higher than a $P^+$ dopant concentration of the body.

14. The device of claim 9, the $N^+$ drain and source regions having a dopant concentration higher than the $N^-$ lightly doped drain and source regions.

15. The device of claim 9, the $P^{++}$ heavily doped region residing alongside at least one of the $N^+$ doped drain and source regions.

16. An SOI multiple NMOS structure, comprising:
- a silicon substrate;
- an insulating oxide layer formed over the substrate;
- a top silicon layer formed over the insulating oxide layer;
- a plurality of gates formed over a portion of the top silicon layer, each of the plurality of gates corresponding to an NMOS structure;
- a gate oxide formed between the plurality of gates and the top silicon layer;
- $N^+$ source and $N^+$ drain regions formed in the top silicon layer for each of the multiple structures;
- $N^-$ lightly doped source and drain extension regions formed in the top silicon layer for each of the multiple structures;
- a $P^{++}$ heavily doped region formed along the length of the top silicon layer extending beneath the plurality of gates, the $P^{++}$ regions having higher dopant concentration than the $N^+$ regions and residing alongside a portion of the respective $N^-$ regions; and
- wherein the $P^{++}$ region provide a capacitive coupling between a body region and a gate for each of the NMOS structures and form a capacitive voltage divider with the junction capacitance of each of the NMOS structures.

17. The structure of claim 16, wherein $N^+$ drain and source regions of abutting structures is a shared doped region forming the $N^+$ drain of one structure and the $N^+$ source region of the other structure.

18. The structure of claim 17, the $P^{++}$ heavily doped region extending alongside each of the $N^+$ source, $N^+$ drain regions, $N^-$ lightly doped source and $N^-$ drain extension regions.

19. A multiple DTMOS structure, comprising:
- at least two abutting DTMOS structures each comprising: a source region, a drain region, a gate region and a body region; and
- a capacitance formed underneath the gate regions and alongside at least one of the source region and the drain region of the at least two abutting DTMOS structures.

* * * * *